(12) United States Patent
Patterson et al.

(10) Patent No.: US 10,791,632 B1
(45) Date of Patent: Sep. 29, 2020

(54) EXTREMELY LOW PROFILE ELECTRICAL INTERCONNECT FOR PRINTED WIRING BOARD

(71) Applicant: RAYTHEON COMPANY, Waltham, MA (US)

(72) Inventors: Chad E. Patterson, Los Angeles, CA (US); Michael M. Fitzgibbon, Playa Del Rey, CA (US)

(73) Assignee: RAYTHEON COMPANY, Waltham, MA (US)

(*) Notice: Subject to any disclaimer, the term of this patent is extended or adjusted under 35 U.S.C. 154(b) by 0 days.

(21) Appl. No.: 16/577,528

(22) Filed: Sep. 20, 2019

(51) Int. Cl.
*H05K 1/11* (2006.01)
*H05K 3/40* (2006.01)
*H05K 3/42* (2006.01)
*H05K 3/04* (2006.01)

(52) U.S. Cl.
CPC ........... *H05K 3/4038* (2013.01); *H05K 1/115* (2013.01); *H05K 3/043* (2013.01); *H05K 3/4061* (2013.01); *H05K 3/42* (2013.01)

(58) Field of Classification Search
CPC ........ H05K 1/113; H05K 1/114; H05K 1/115; H05K 1/117; H05K 3/46; H05K 3/4614; H05K 3/4623; H05K 3/4038
See application file for complete search history.

(56) References Cited

U.S. PATENT DOCUMENTS

| 5,618,205 | A | 4/1997 | Riddle et al. |
| 6,366,185 | B1 | 4/2002 | Keesey et al. |
| 6,534,726 | B1* | 3/2003 | Okada ............... H01L 23/49805 174/260 |
| 6,958,670 | B2 | 10/2005 | Winslow et al. |
| 9,660,333 | B2 | 5/2017 | Viscarra et al. |
| 2003/0232462 | A1* | 12/2003 | Poo ......................... H01L 23/13 438/117 |

* cited by examiner

*Primary Examiner* — Jeremy C Norris
(74) *Attorney, Agent, or Firm* — Cantor Colburn LLP (57) ABSTRACT

A board element for board-to-board interconnect formation is provided. An embodiment includes embedding a signal via element in the board element and cutting through respective sections of the board element and the signal via element to expose a new board element edge and an outwardly facing surface of the signal via element.

21 Claims, 6 Drawing Sheets

EXTREMELY LOW PROFILE ELECTRICAL INTERCONNECT FOR PRINTED WIRING BOARD

BACKGROUND

The present disclosure relates to electrical interconnects and, in particular, to electrical interconnects for printed wiring boards (PWBs) where the electrical interconnects have extremely low profiles.

Board-to-board electrical interconnects allow for electrical intercommunications between two or more PWBs in a system. Where the system is complex, the number of electrical interconnects can be significant and insuring that each electrical interconnect is properly formed and reliable can be an important aspect in fabrication and assembly processes.

Historically, the formation of electrical interconnect has been difficult to achieve without consuming significant real estate of the PWBs involved. Standard approaches typically required connections located on the top or bottom board faces and thus consumed critical three-dimensional space. As a result, edge bonding was developed and can refer to wire bonding, flexible (flex) circuits and edge plating among others. Wire bonding is time consuming, labor intensive and drives specific board fabrication processes for bonding compatibility. Flex circuits require additional parts and soldering processes. Edge plating requires that copper be disposed to wrap around the top and bottom of the board, which complicates sub-assembly processes to ensure the board is not mounted on a plate such that a short would occur. Meanwhile, the use of conductive epoxy or solder joints are sources of potential failure for assemblies subjected to environmental requirements.

In some cases, electrical interconnects in the form of edge mount connectors can be used but often require soldering to the top surface which adds cost and potential for conductive joint failures. Additionally, mini SMPs can require a relatively large insertion force as compared to other types of devices (i.e., spring probes). In other cases, solderless interconnects into PWBs can be used and are normally formed with a vertical transition that is directed normal to the plane of the PWB where the contacts hit a pad on the top or bottom of the PWBs. This can takes up significant real-estate and limits packaging freedom.

SUMMARY

According to an aspect of the disclosure, a method of preparing a board element for board-to-board interconnect formation is provided. The method includes embedding a signal via element in the board element and cutting through respective sections of the board element and the signal via element to expose a new board element edge and an outwardly facing surface of the signal via element.

In accordance with additional or alternative embodiments, the cutting is executed such that the outwardly facing surface of the signal via element is substantially flush with the new board element edge.

In accordance with additional or alternative embodiments, the board element includes dielectric layers interleaved with a top metallic layer, a bottom metallic layer and intermediate metallic layers and the embedding includes embedding the signal via element between the top and bottom metallic layers and surrounding the signal via element with dielectric material.

In accordance with additional or alternative embodiments, the embedding includes embedding ground via elements in the board element, the cutting includes cutting through the respective sections of the board element and the signal via element and cutting through sections of the ground via elements to expose the new board element edge, the outwardly facing surface of the signal via element and outwardly facing surfaces of the ground via elements and the cutting is executed such that the outwardly facing surfaces of the ground via elements are substantially flush with the new board element edge and the outwardly facing surface of the signal via element.

In accordance with additional or alternative embodiments, the signal via element has a pill-shape with an elongate section and the section of the signal via element through which the signal via element is cut includes the elongate section.

In accordance with additional or alternative embodiments, the method further includes defining a cutting line for guiding the cutting and a length of an elongate section of the signal via element allows for ±tolerances in the defining of the cutting line.

In accordance with additional or alternative embodiments, the signal via element is buried and castellated, a first portion of the outwardly facing surface of the signal via element is substantially flush with the new board element edge and a second portion of the outwardly facing surface of the signal via element is recessed from the new board element edge.

According to another aspect of the disclosure, a method of forming board-to-board interconnects is provided. The method includes assembling a board element with one or more signal via elements embedded therein, cutting through respective sections of the board element and the one or more signal via elements to expose a new board element edge and an outwardly facing surface of each of the one or more signal via elements and disposing an electrically conductive element in electrical communication with the outwardly facing surface of each of the one or more signal via elements.

In accordance with additional or alternative embodiments, the cutting is executed such that the outwardly facing surface of each of the one or more signal via elements is substantially flush with the new board element edge.

In accordance with additional or alternative embodiments, the board element includes dielectric layers interleaved with a top metallic layer, a bottom metallic layer and intermediate metallic layers and the embedding includes embedding the one or more signal via elements between the top and bottom metallic layers and surrounding each of the one or more signal via elements with dielectric material.

In accordance with additional or alternative embodiments, the embedding includes embedding ground via elements in the board element, the cutting includes cutting through the respective sections of the board element and the one or more signal via elements and cutting through sections of the ground via elements to expose the new board element edge, the outwardly facing surface of each of the one or more signal via elements and outwardly facing surfaces of the ground via elements and the cutting is executed such that the outwardly facing surfaces of the ground via elements are substantially flush with the new board element edge and the outwardly facing surface of each of the one or more signal via elements.

In accordance with additional or alternative embodiments, each of the one or more signal via elements has a pill-shape with an elongate section and the section of each of the one or more signal via elements through which each of the one or more signal via elements is cut includes the elongate section.

In accordance with additional or alternative embodiments, the method further includes defining a cutting line for guiding the cutting and a length of an elongate section of each of the one or more signal via elements allows for ±tolerances in the defining of the cutting line.

In accordance with additional or alternative embodiments, each electrically conductive element includes one or more of a spring connector, a compliant connector and a fixed connector.

In accordance with additional or alternative embodiments, the board element includes a printed wiring board (PWB) and each electrically conductive element is supported in a multi-pin connector body which is configured for engagement with the PWB.

In accordance with additional or alternative embodiments, each electrically conductive element is a power, signal or ground interconnect and is supported in an assembly to which the board element is configured for engagement.

In accordance with additional or alternative embodiments, the one or more signal via elements are buried and castellated, a first portion of the outwardly facing surface of each of the one or more signal via elements is substantially flush with the new board element edge and a second portion of the outwardly facing surface of each of the one or more signal via element is recessed from the new board element edge.

According to another aspect of the invention, a board-to-board interconnect formation is provided and includes a board element that includes dielectric layers interleaved with a top metallic layer, a bottom metallic layer and intermediate metallic layers and either or both of one or more signal via elements and one or more of buried and castellated signal via elements. The one or more signal via elements are embedded in the board element between the top and bottom metallic layers and surrounded by dielectric material. The board element further includes an edge and each of the one or more signal via elements includes an outwardly facing surface which is flush with the edge. The one or more buried and castellated signal via elements are embedded in the board element between the top and bottom metallic layers and surrounded by dielectric material. The board element further includes an edge and each of the one or more buried and castellated signal via elements includes an outwardly facing surface and each outwardly facing surface includes a first portion, which is flush with the edge, and a second portion, which is recessed from the edge.

In accordance with additional or alternative embodiments, the outwardly facing surface of each of the one or more signal via elements and each of the one or more buried and castellated signal via elements is plated.

In accordance with additional or alternative embodiments, ground via elements are embedded in the board element. The ground via elements include outwardly facing surfaces flush with the edge and the outwardly facing surface of each of the one or more signal via elements or the ground via elements are buried and castellated.

In accordance with additional or alternative embodiments, each of the one or more signal via elements and each of the one or more buried and castellated signal via elements has a segmented pill-shape with an elongate section.

In accordance with additional or alternative embodiments, an electrically conductive element is disposed in electrical communication with the outwardly facing surface of each of the one or more signal via elements and each of the one or more buried and castellated signal via elements. Each electrically conductive element includes one or more of a spring connector, a compliant connector and a fixed connector, the board element includes a printed wiring board (PWB) and each electrically conductive element is supported in a multi-pin connector body which is configured for engagement with the PWB.

In accordance with additional or alternative embodiments, an electrically conductive element is disposed in electrical communication with the outwardly facing surface of each of the one or more signal via elements and each of the one or more buried and castellated signal via elements. Each electrically conductive element includes one or more of a spring connector, a compliant connector and a fixed connector and each electrically conductive element is a power, signal or ground interconnect and is supported in an assembly to which the board element is configured for engagement.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As will be described below, embedded and metal-filled via structures that are positioned on a board edge are milled to expose a flat surface coincident with the board edge and/or a buried and castellated surface that is recessed from the board edge. These are treated as 'pads' located on the board edge or recessed from the board edge and can be interfaced with pogo-pins or solderable or epoxied interconnects. This allows for an extremely low profile, lateral electrical interconnect with minimal impact to board space. The interconnect diameter and height can be customized. Additionally, a pitch of electrical interconnects is limited only by a desired via-to-via minimum spacing.

Figure 1:
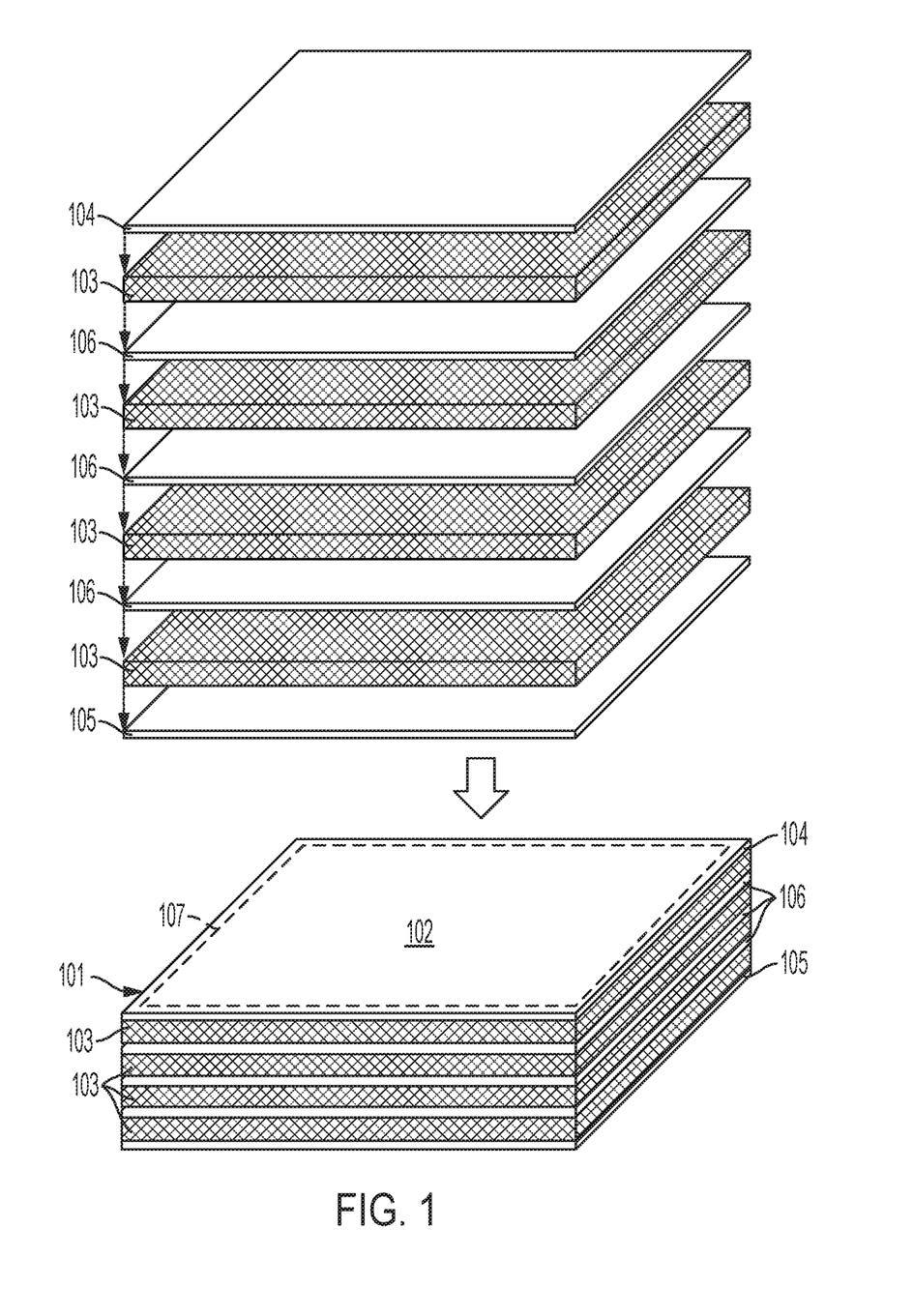
FIG. 1 is an exploded perspective view and a perspective view of a printed wiring board in accordance with embodiments.

With reference to FIGS. 1-5, a method of preparing a board element for board-to-board interconnect formation is provided. As shown in FIG. 1, the method can initially include an assembly of a board element 101, which can be, but is not required to be provided as a printed wiring board (PWB) 102 (see FIG. 5). In those cases in which the board element 101 is provided as the PWB 102, the board element 101 can, but is not required to, include dielectric layers 103 interleaved with a top metallic layer 104, a bottom metallic layer 105 and intermediate metallic layers 106.

It is to be understood that, while the board element 101 is not required to be provided as the PWB 102, the following description will relate to the cases in which the board element 101 is provided as the PWB 102 and includes the dielectric layers 103 interleaved with the top metallic layer 104, the bottom metallic layer 105 and the intermediate metallic layers 106. This is being done for purposes of clarity and brevity and is not intended to otherwise limit a scope of the application.

Figure 2:
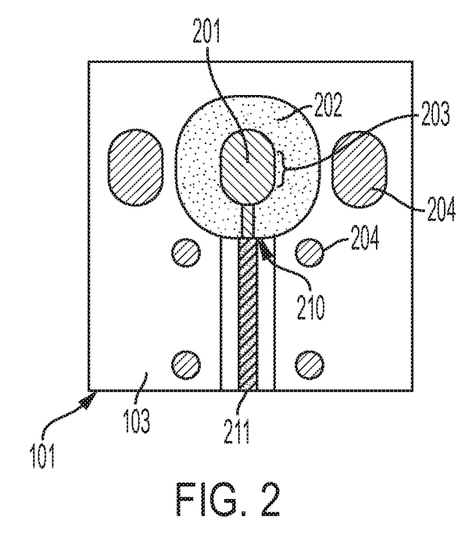
FIG. 2 is a top-down view of a cross-section of a printed wiring board with an embedded via element at an initial fabrication stage in accordance with embodiments.

As shown in FIG. 2, with the board element 101 assembled or during the assembly of the board element 101, a signal via element 201 is embedded in the board element 101 (not shown in FIG. 1) between the top metallic layer 104 (see FIG. 5) and the bottom metallic layer 105 (see FIG. 5) and is surrounded by dielectric material 202 that may be similar to or different from dielectric materials of the dielectric layers 103. When the signal via element 201 is initially embedded, the signal via element 201 can be provided as a component of a signal via 210, which also includes a trace 211 that extends from the signal via element 201 into the board element 101, and can have a discorectangular- or pill-shape with an elongate section 203 and curved ends on opposite sides of the elongate section 203. The dielectric material 202 surrounding the signal via element 201 can have a similar shape.

Figure 5:
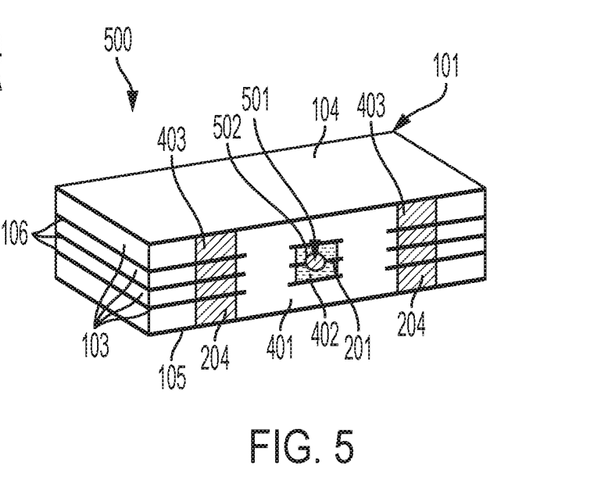
FIG. 5 is a perspective view of a printed wiring board with an embedded via element following a milling operation in accordance with embodiments.

In accordance with embodiments, in addition to the signal via element 201, ground via elements 204 can also be embedded in the board element 101 (not shown in FIG. 1) between the top metallic layer 104 (see FIG. 5) and the bottom metallic layer 105 (see FIG. 5). The ground via elements 204 can be disposed adjacent to the signal via element 201 or at locations defined along the trace 211. For those ground via elements 204 adjacent to the signal via element 201, in particular, i.e., the proximal ground via elements 204, the proximal ground via elements 204 can have a discorectangular- or pill-shape similar to that of the signal via element 201.

In accordance with embodiments, a pitch of the signal via element 201 and the proximal ground via elements 204 can be varied for various types of applications and is effectively limited only by a desired minimum spacing.

In accordance with embodiments, the signal via element 201 and the proximal ground via elements 204 can be embedded in the board element 101 at or near a periphery 107 (see FIG. 1) of the board element 101. In accordance with embodiments, a width of the periphery 107 of the board element 101 can be on the order of about 10 mils. As such, cutting of the board element 101 to expose a new board element edge and outwardly facing surfaces of the signal via element 201 and the ground via elements 204, which will be described below, will result in limited removal of material from the board element 101.

Figure 3:
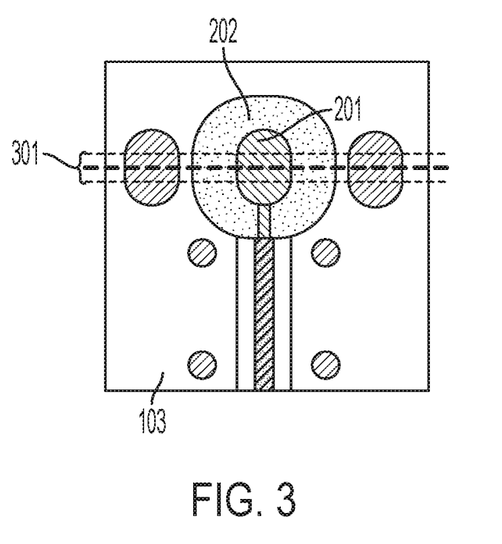
FIG. 3 is a top-down view of a cross-section of a printed wiring board with an embedded via element at an intermediate fabrication stage in accordance with embodiments.

As shown in FIG. 3, a cutting line 301 can be, but is not required to be, defined through respective sections of the board element 101, the signal via element 201 and the proximal ground via elements 204. The cutting line 301, when used, can be drawn on the board element 101 or formed by laser light. In any case, the section of the signal via element 201 through which the cutting line 301 extends can be the elongate section 203 of the signal via element 201 (and corresponding sections of the proximal ground via elements 204) whereby a length of the elongate section 203 allows for ±tolerances in the defining of the cutting line 301 (see the dashed lines of FIG. 3). These ±tolerances can be on the order of less than about 10 mils. Where the signal via element 201 and the proximal ground via elements 204 are embedded in the board element 101 at or near a periphery 107 (see FIG. 1) of the board element 101, the cutting line 301 may similarly be defined at or near the periphery 107.

Although the cutting line 301 is illustrated in FIG. 3 as being defined as a straight line at or near the periphery 107, it is to be understood that this is not required and that the cutting line 301 can include one or more corners and/or one or more curvatures and can be defined at various locations throughout the board element 101.

Figure 4:
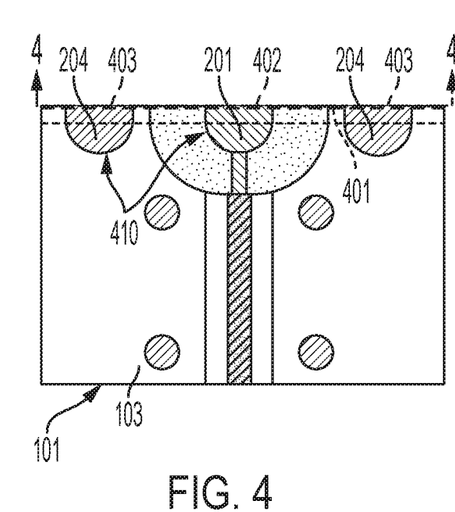
FIG. 4 is a top-down view of a cross-section of a printed wiring board with an embedded via element at a late fabrication stage in accordance with embodiments.

As shown in FIG. 4, the respective sections of the board element 101, the signal via element 201 and the proximal ground via elements 204 are cut to expose a new board element edge 401. The cutting can be conducted along the cutting line 301 (see FIG. 3) or, in the case of certain cutting processes, such as milling or laser cutting, the cutting can be conducted without a cutting line 301 being drawn. In any case, the cutting serves to expose a new board element edge 401, an outwardly facing surface 402 of the signal via element 201 and outwardly facing surfaces 403 of the proximal ground via elements 204.

The cutting can be executed by any cutting, machining or milling process and is executed such that the outwardly facing surface 402 of the signal via element 201 and the outwardly facing surfaces 403 of the proximal ground via elements 204 are substantially flush with the new board element edge 401. At least the outwardly facing surface 402 of the signal via element 201 can thus be treated as a pad for formation of an electrical interconnect. As used herein, the phrase "substantially flush" can generally refer to surfaces being coplanar with one another to within local machining tolerances (i.e., on the order of less than about 10 mils).

As a result of the cutting, the signal via element 201 and the proximal ground via elements 204 are left with a segmented discorectangular- or pill-shape 410.

Although the processes described above relate to cases in which a signal via element 201 and proximal ground via elements 204 are embedded in the board element 101, it is to be understood that one or more signal via elements 201 can be embedded in the board element 101. In some cases, a multitude of signal via elements 201 and a corresponding multitude of proximal ground via elements 204 can be embedded in the board element 101.

As shown in FIG. 5, a structure resulting from the processes described above is a board-to-board interconnect formation 500 and includes the board element 101, one or more signal via elements 201 and proximal ground via elements 204. The board element 101 includes the dielectric layers 103 interleaved with the top metallic layer 104, the bottom metallic layer 105 and the intermediate metallic layers 106. The one or more signal via elements 201 are embedded in the board element 101 between the top metallic layer 104 and the bottom metallic layer 105 and are each surrounded by the dielectric material 202. The proximal ground via elements 204 are embedded in the board element 101 between the top metallic layer 104 and the bottom metallic layer 105. The board element 101 further includes the board element edge 401, each of the one or more signal via elements 201 includes the outwardly facing surface 402, which is substantially flush with the board element edge 401, and each of the proximal ground via elements 204 includes the outwardly facing surface 403, which is substantially flush with the board element edge 401.

Figure 6:
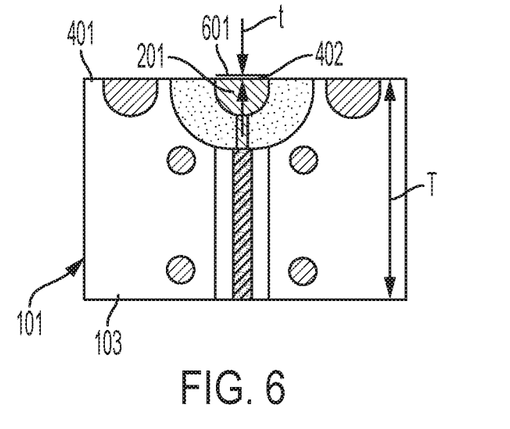
FIG. 6 is a top-down view of a cross-section of a printed wiring board at an intermediate fabrication stage in accordance with further embodiments.

With reference to FIG. 6 and in accordance with additional or alternative embodiments, the outwardly facing surface 402 of each of the one or more signal via elements 201 can be plated with, for example, an electroless gold finish (ENIG, ENEPIG, etc.) 601 that has a thickness t, which is much smaller than a corresponding thickness T of the board element 101 (t<<T).

Figure 7:
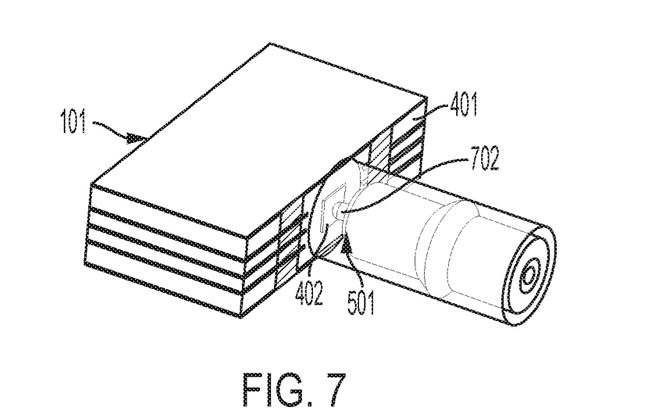
FIG. 7 is a perspective view of a board-to-board interconnect formation with an electrically conductive element in accordance with embodiments.
Figure 8:
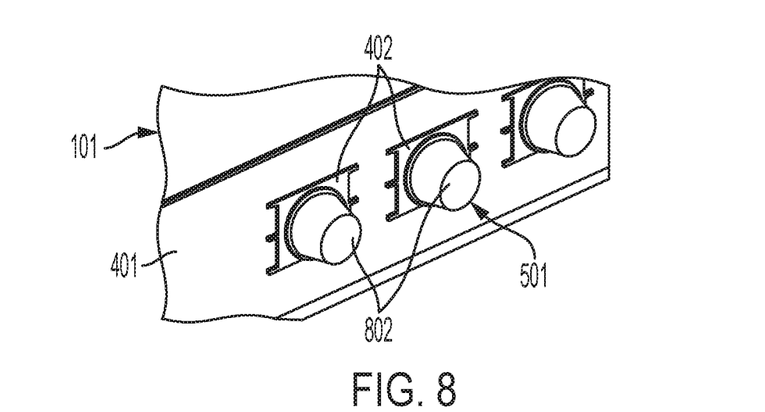
FIG. 8 is a perspective view of a board-to-board interconnect formation with an electrically conductive element in accordance with embodiments.

With reference back to FIG. 5 and with additional reference to FIGS. 7 and 8, the board-to-board interconnect formation 500 can further include an electrically conductive element 501 that is disposed in electrical communication with the outwardly facing surface 402 of each of the one or more signal via elements 201. Each electrically conductive element 501 can include or be provided as one or more of a spring connector 702 (see FIG. 7), such as a radio frequency (RF) coaxial pogo-pin, a compliant connector 802 (see FIG. 8), such as an elastomeric interconnect, and a fixed connector 502 (see FIG. 5). In at least the cases in which the electrically conductive element 501 includes or is provided as the compliant connector 802 or the fixed connector 502, the electrically conductive element 501 can be secured in electrical communication with the corresponding outwardly facing surface 402 by a fastener or by solder, epoxy or another suitable adhesive.

Figure 9:
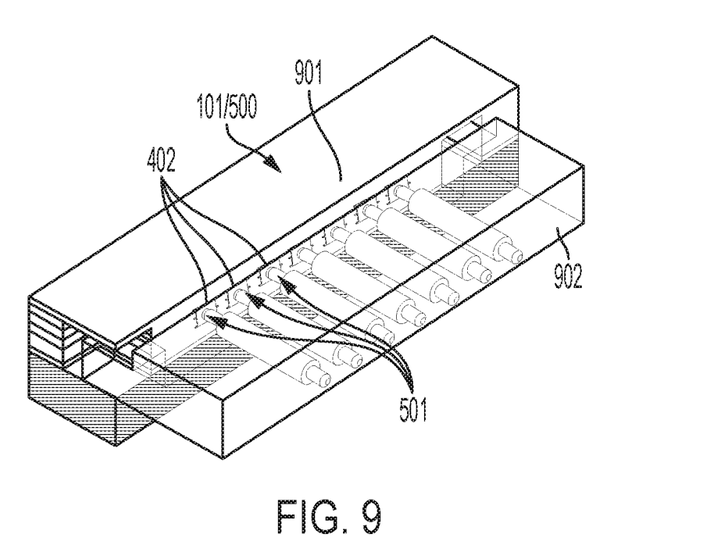
FIG. 9 is a perspective view of board-to-board interconnect formations with electrically conductive elements in accordance with embodiments.

With continued reference to FIGS. 5, 7 and 8 and with additional reference to FIG. 9, the board element 101 (or the board-to-board interconnect formation 500) can include or be provided as a PWB 901 with outwardly facing surfaces 402 (of signal via elements 201, not shown in FIG. 9) and each electrically conductive element 501 can be supported in a multi-pin connector body 902, which is configured for engagement with the PWB 901 such that each electrically conductive element 501 can be disposed in electrical communication with the outwardly facing surfaces 402. In this or other cases, the PWB 901 can be formed to define guide slots and the multi-pin connector body 902 can include bosses which are slidable into the guide slots by a predefined distance so as to establish reliable electrical communication between each electrically conductive element 501 and the corresponding outwardly facing surfaces 402.

Figure 10:
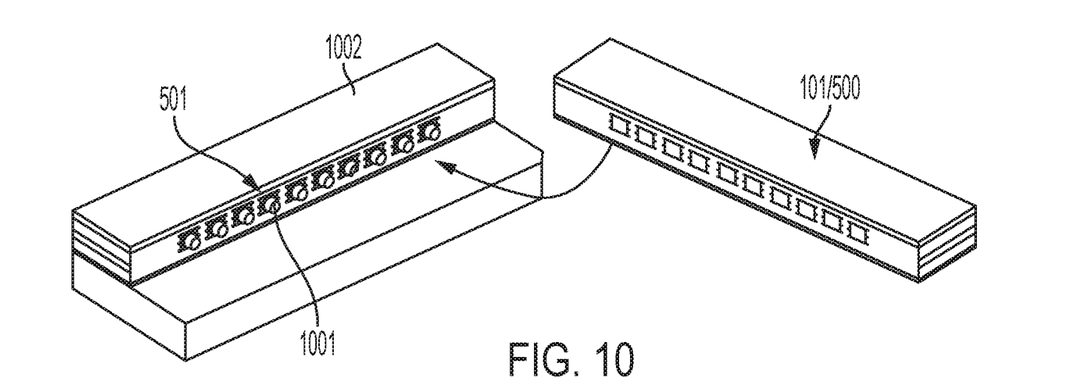
FIG. 10 is a perspective view of board-to-board interconnect formations with electrically conductive elements in accordance with embodiments.

With continued reference to FIGS. 5, 7 and 8 and with additional reference to FIG. 10, each electrically conductive element 501 can be a power, signal (i.e., alternating current (AC) signal, direct current (DC) signal or radio frequency (RF) signal) or ground interconnect 1001, such as a ground-signal-ground RF interconnect, and can be supported in an assembly 1002 to which the board element 101 is configured for engagement. In this or other cases, the assembly 1002 can itself be configured as a substrate on which a board element is supported with electrically conductive elements disposed in electrical communication with outwardly facing surfaces of signal via elements as shown in FIG. 10.

Figure 11:
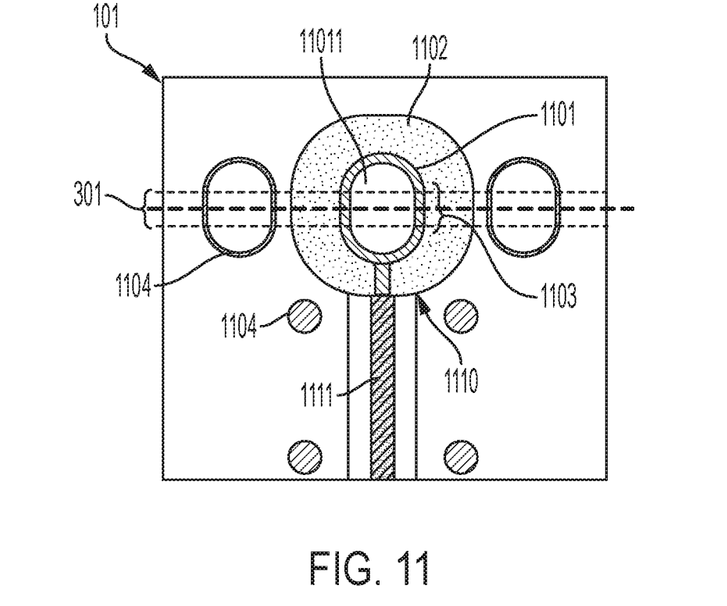
FIG. 11 is a top-down view of a cross-section of a printed wiring board with an embedded castellated via element at an intermediate fabrication stage in accordance with embodiments.
Figure 12:
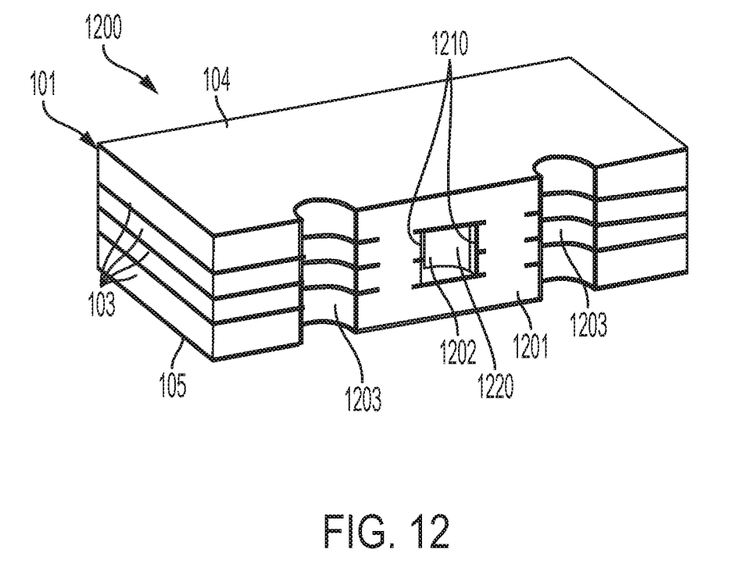
FIG. 12 is a perspective view of a printed wiring board with an embedded castellated via element following a milling operation in accordance with embodiments.

In accordance with further embodiments and with reference to FIGS. 11 and 12, a buried and castellated signal via element 1101 can be embedded in the board element 101 between the top metallic layer 104 (see FIG. 12) and the bottom metallic layer 105 (see FIG. 12) and is surrounded by dielectric material 1102 that may be similar to or different from dielectric materials of the dielectric layers 103. As above, when the buried and castellated signal via element 1101 is initially embedded, the buried and castellated signal via element 1101 can be provided as a component of a signal via 1110, which also includes a trace 1111 that extends from the buried and castellated signal via element 1101 into the board element 101, and can have a discorectangular- or pill-shape with an elongate section 1103 and curved ends on opposite sides of the elongate section 1103. The dielectric material 1102 surrounding the buried and castellated signal via element 1101 can have a similar shape.

In accordance with embodiments, in addition to the buried and castellated signal via element 1101, ground via elements 1104 can also be embedded in the board element 101 between the top metallic layer 104 (see FIG. 12) and the bottom metallic layer 105 (see FIG. 12). The ground via elements 204 can be disposed adjacent to the buried and castellated signal via element 1101 or at locations defined along the trace 1111. For those ground via elements 1104 adjacent to the buried and castellated signal via element 1101, in particular, i.e., the proximal ground via elements 1104, the proximal ground via elements 1104 can also be buried and castellated and can have a discorectangular- or pill-shape similar to that of the buried and castellated signal via element 1101 (hereinafter the proximal ground via elements 1104 will be referred to as the "proximal buried and castellated ground via elements 1104").

Further details of FIG. 11 are similar to those described above and need not be repeated except as provided below.

As shown in FIG. 11, a cutting line 301 can be, but is not required to be, defined through respective sections of the board element 101, the buried and castellated signal via element 1101 and the proximal buried and castellated ground via elements 1104. The cutting line 301, when used, can be drawn on the board element 101 or formed by laser light. In any case, the section of the buried and castellated signal via element 1101 through which the cutting line 301 extends can be the elongate section 1103 (and corresponding sections of the proximal buried and castellated ground via elements 1104) whereby a length of the elongate section 203 allows for ±tolerances in the defining of the cutting line 301 (see the dashed lines of FIG. 11). These ±tolerances can be on the order of less than about 10 mils. Where the buried and castellated signal via element 1101 and the proximal buried and castellated ground via elements 1104 are embedded in the board element 101 at or near a periphery 107 (see FIG.

1) of the board element 101, the cutting line 301 may similarly be defined at or near the periphery 107.

Although the cutting line 301 is illustrated in FIG. 11 as being defined as a straight line at or near the periphery 107, it is to be understood that this is not required and that the cutting line 301 can include one or more corners and/or one or more curvatures and can be defined at various locations throughout the board element 101.

The buried and castellated signal via element 1101 can be formed by various processes including, but not limited to, dissolvable via fill processes, pre-cut prepreg formation and sub-lamination processing. In dissolvable via fill processes, a signal via element is formed by drilling and plating processes that result in an open cavity 11011 that can be filled with a dissolvable material that can be dissolved by later exposure to a solvent. In pre-cut prepreg formation, a signal via element is formed by drilling and plating processes whereupon pre-cut sequential lamination prepregs are disposed and prevented from flowing into the empty via hole by a Teflon™ tab in the shape of a pre-cut prepreg hole that fills the void during sequential laminations. In sub-lamination processing, sub-laminations are created with plated via holes and laminated with Ormet™/Polyimide materials. In some cases, the sub-lamination processing can be conducted as a subcategory of the pre-cut prepreg formation technique. In both techniques, the prepreg has to be kept out of holes in the final lamination (i.e., by Teflon™ tabs or similar features).

The respective sections of the board element 101, the buried and castellated signal via element 1101 and the proximal buried and castellated ground via elements 1104 can be cut to expose a new board element edge 1201, an outwardly facing surface 1202 of the buried and castellated signal via element 1101 and outwardly facing surfaces 1203 of the proximal buried and castellated ground via elements 1104. The cutting can be conducted along the cutting line 301 or, in the case of certain cutting processes, such as milling or laser cutting, the cutting can be conducted without a cutting line 301 being drawn.

Following the cutting and once the pocket/void of the buried and castellated signal via element 1101 is removed, the outwardly facing surface 1202 includes first portions 1210 that are substantially flush with the new board element edge 1201 and second portions 1220 that are recessed from the new board element edge 1201. The outwardly facing surfaces 1203 of the proximal buried and castellated ground via elements 1104 have similar structures. The cutting can be executed by any cutting, machining or milling process and the first and second portions 1210 and 1220 of the outwardly facing surface 1202 of the buried and castellated signal via element 1101 can be treated as a pad for formation of an electrical interconnect.

As a result of the cutting, the buried and castellated signal via element 1101 and the proximal buried and castellated ground via elements 1104 are left with a hollow segmented discorectangular- or pill-shape.

Although the processes described above relate to cases in which a buried and castellated signal via element 1101 and proximal buried and castellated ground via elements 1104 are embedded in the board element 101, it is to be understood that one or more buried and castellated signal via elements 1101 can be embedded in the board element 101. In some cases, a multitude of buried and castellated signal via elements 1101 and a corresponding multitude of proximal buried and castellated ground via elements 1104 can be embedded in the board element 101.

As shown in FIG. 12, a structure resulting from the processes described above is a board-to-board interconnect formation 1200 and includes the board element 101, one or more buried and castellated signal via elements 1101 and proximal buried and castellated ground via elements 1104. The board element 101 includes the dielectric layers 103 interleaved with the top metallic layer 104, the bottom metallic layer 105 and the intermediate metallic layers 106. The one or more buried and castellated signal via elements 1101 are embedded in the board element 101 between the top metallic layer 104 and the bottom metallic layer 105 and are each surrounded by the dielectric material 202. The proximal buried and castellated ground via elements 1104 are embedded in the board element 101 between the top metallic layer 104 and the bottom metallic layer 105. The board element 101 further includes the board element edge 1201, each of the one or more buried and castellated signal via elements 1101 includes the outwardly facing surface 1202, of which the first portion 1210 is substantially flush with the board element edge 1201 and the second portion 1220 is recessed from the board element edge 1201, and each of the proximal buried and castellated ground via elements 1104 includes the similarly structured outwardly facing surface 1203.

Figure 13:
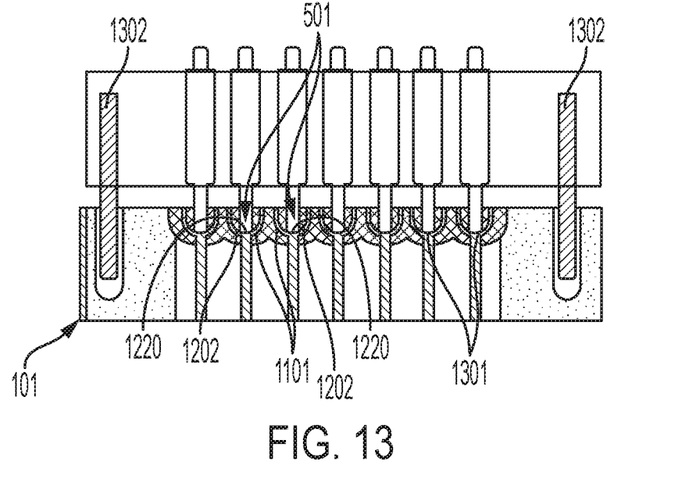
FIG. 13 is a top-down view of board-to-board interconnect formations with electrically conductive elements in accordance with embodiments.

The features of FIGS. 6-10 and the accompany text are applicable to the embodiments of FIGS. 11 and 12. For example, the first and second portions 1210 and 1220 of the outwardly facing surface 1202 of each of the one or more buried and castellated signal via elements 1101 can be plated as shown in FIG. 6. Similarly, with reference to FIG. 13, each electrically conductive element 501 (which can be provided as shown and described above with reference to any of the embodiments of FIGS. 5-7) can make electrical contact with at least the second portion 1220 of the outwardly facing surfaces 1202 by extending into the recesses of the buried and castellated signal via elements 1101. In doing so, as shown in FIG. 13, the pogo-pin interconnects are aligned with similar edge via constructions that have lengthened elongate portions. Due to its configuration, each resulting buried castellated via 1301 acts as a hole for assisting with and improving alignment. Dowel pins 1302 can be employed for initial insertion alignment as well.

It is to be understood that the various embodiments described herein can be combined in various manners. For example, the embodiments relating to the signal via elements can be provided alone, the embodiments relating to the buried and castellated signal via elements can be provided alone and embodiments are possible in which one or more signal via elements are provided in combination with one or more castellated signal via elements (i.e., either or both of flush signal via elements and buried and castellated signal via elements).

Technical effects and benefits of the present invention are the provision of board-to-board electrical interconnects that are substantially flush with a board edge or are recessed or indented from the board edge, that do not consume significant PWB real estate and which can be formed using simple and reliable processes. In the case of buried and castellated signal via elements, the buried and castellated signal via elements additionally provide for guidance and alignment effects that can be used to improve a reliability of electrical connections.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A method of preparing a board element for board-to-board interconnect formation, the board element comprising dielectric layers interleaved with top, bottom and intermediate metallic layers, the method comprising:
    embedding a signal via element in the board element between the top and bottom metallic layers;
    surrounding the signal via element with surrounding dielectric material; and
    cutting through respective sections of the board element and the signal via element to expose a new board element edge and respective outwardly facing surfaces of respective remainders of the signal via element and the surrounding dielectric material.

2. The method according to claim 1, wherein the cutting is executed such that the outwardly facing surface of the signal via element is flush with the new board element edge.

3. The method according to claim 1, wherein:
    the embedding comprises embedding ground via elements in the board element,
    the cutting comprises cutting through the respective sections of the board element and the signal via element and cutting through sections of the ground via elements to expose the new board element edge, the outwardly facing surface of the remainder of the signal via element and respective outwardly facing surfaces of remainders of the ground via elements, and
    the cutting is executed such that the respective outwardly facing surfaces of the remainders of the ground via elements are flush with the new board element edge and the outwardly facing surface of the remainder of the signal via element.

4. The method according to claim 1, wherein:
    the signal via element has a pill-shape with an elongate section, and
    the section of the signal via element through which the signal via element is cut comprises the elongate section.

5. The method according to claim 1, further comprising defining a cutting line for guiding the cutting, wherein a length of an elongate section of the signal via element allows for ±tolerances in the defining of the cutting line.

6. The method according to claim 1, wherein:
    the signal via element is buried and castellated,
    a first portion of the outwardly facing surface of the remainder of the signal via element is flush with the new board element edge, and
    a second portion of the outwardly facing surface of the remainder of the signal via element is recessed from the new board element edge.

7. A method of forming board-to-board interconnects, the method comprising:
    assembling a board element to comprise dielectric layers interleaved with top, bottom and intermediate metallic layers with one or more signal via elements embedded between the top and bottom metallic layers;
    surrounding each of the one or more signal via elements with surrounding dielectric material;
    cutting through respective sections of the board element and the one or more signal via elements to expose a new board element edge and respective outwardly facing surfaces of respective remainders of each of the one or more signal via elements and the surrounding dielectric material; and
    disposing an electrically conductive element in electrical communication with the respective outwardly facing surfaces of the respective remainders of each of the one or more signal via elements.

8. The method according to claim 7, wherein the cutting is executed such that the respective outwardly facing surfaces of the respective remainders of each of the one or more signal via elements is flush with the new board element edge.

9. The method according to claim 7, wherein:
    the embedding comprises embedding ground via elements in the board element,
    the cutting comprises cutting through the respective sections of the board element and the one or more signal via elements and cutting through sections of the ground via elements to expose the new board element edge, the respective outwardly facing surfaces of the respective remainders of each of the one or more signal via elements and respective outwardly facing surfaces of the respective remainders of the ground via elements, and
    the cutting is executed such that the respective outwardly facing surfaces of the respective remainders of the ground via elements are flush with the new board element edge and the respective outwardly facing surfaces of the respective remainders of each of the one or more signal via elements.

10. The method according to claim 7, wherein:
    each of the one or more signal via elements has a pill-shape with an elongate section, and
    the section of each of the one or more signal via elements through which each of the one or more signal via elements is cut comprises the elongate section.

11. The method according to claim 7, further comprising defining a cutting line for guiding the cutting, wherein a length of an elongate section of each of the one or more signal via elements allows for ±tolerances in the defining of the cutting line.

12. The method according to claim 7, wherein each electrically conductive element comprises one or more of a spring connector, a compliant connector and a fixed connector.

13. The method according to claim 7, wherein the board element comprises a printed wiring board (PWB) and each electrically conductive element is supported in a multi-pin connector body which is configured for engagement with the PWB.

14. The method according to claim 7, wherein each electrically conductive element is a power, signal or ground interconnect and is supported in an assembly to which the board element is configured for engagement.

15. The method according to claim 7, wherein:
the one or more signal via elements are buried and castellated,
a first portion of the respective outwardly facing surfaces of the respective remainders of each of the one or more signal via elements is flush with the new board element edge, and
a second portion of the respective outwardly facing surfaces of each of the one or more signal via element is recessed from the new board element edge.

16. A board-to-board interconnect formation, comprising:
a board element comprising dielectric layers interleaved with a top metallic layer, a bottom metallic layer and intermediate metallic layers; and
either or both of:
one or more signal via elements embedded in the board element between the top and bottom metallic layers and surrounded by surrounding dielectric material, the board element further comprising an edge and each of the one or more signal via elements and the surrounding dielectric material comprising respective outwardly facing surfaces flush with the edge; and
one or more buried and castellated signal via elements embedded in the board element between the top and bottom metallic layers and surrounded by surrounding dielectric material, the board element further comprising an edge and each of the one or more buried and castellated signal via elements and the surrounding dielectric material comprising respective outwardly facing surfaces and each outwardly facing surface comprising a first portion, which is flush with the edge, and a second portion, which is recessed from the edge.

17. The board-to-board interconnect formation according to claim 16, wherein the outwardly facing surface of each of the one or more signal via elements and each of the one or more buried and castellated signal via elements is plated.

18. The board-to-board interconnect formation according to claim 16, further comprising ground via elements embedded in the board element,
the ground via elements comprising outwardly facing surfaces flush with the edge and the respective outwardly facing surfaces of each of the one or more signal via elements, or
the ground via elements are buried and castellated.

19. The board-to-board interconnect formation according to claim 16, wherein each of the one or more signal via elements and each of the one or more buried and castellated signal via elements has a segmented pill-shape with an elongate section.

20. The board-to-board interconnect formation according to claim 16, further comprising an electrically conductive element disposed in electrical communication with the respective outwardly facing surfaces of each of the one or more signal via elements and each of the one or more buried and castellated signal via elements, wherein:
each electrically conductive element comprises one or more of a spring connector, a compliant connector and a fixed connector,
the board element comprises a printed wiring board (PWB), and
each electrically conductive element is supported in a multi-pin connector body which is configured for engagement with the PWB.

21. The board-to-board interconnect formation according to claim 16, further comprising an electrically conductive element disposed in electrical communication with the respective outwardly facing surfaces of each of the one or more signal via elements and each of the one or more buried and castellated signal via elements, wherein:
each electrically conductive element comprises one or more of a spring connector, a compliant connector and a fixed connector, and
each electrically conductive element is a power, signal or ground interconnect and is supported in an assembly to which the board element is configured for engagement.

* * * * *